United States Patent
Otsubo

(10) Patent No.: US 10,312,172 B2
(45) Date of Patent: Jun. 4, 2019

(54) HIGH-FREQUENCY MODULE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/919,367

(22) Filed: Mar. 13, 2018

(65) Prior Publication Data
US 2018/0204781 A1 Jul. 19, 2018

Related U.S. Application Data

(63) Continuation of application No. PCT/JP2016/076753, filed on Sep. 12, 2016.

(30) Foreign Application Priority Data

Sep. 14, 2015 (JP) .................. 2015-180971

(51) Int. Cl.
*H05K 9/00* (2006.01)
*H01L 23/31* (2006.01)
(Continued)

(52) U.S. Cl.
CPC .......... *H01L 23/3121* (2013.01); *H01L 23/28* (2013.01); *H01L 23/552* (2013.01);
(Continued)

(58) Field of Classification Search
CPC ..... H01L 23/3121; H01L 23/28; H01L 24/82; H01L 25/04; H01L 25/18; H05K 1/02; H05K 9/00; H05K 9/0081
(Continued)

(56) References Cited

U.S. PATENT DOCUMENTS 4,648,128 A * 3/1987 Saka .................... H05K 9/0056
334/85
7,659,604 B2 * 2/2010 Fujiwara ................. H01L 23/29
257/659
(Continued)

FOREIGN PATENT DOCUMENTS

JP 2010-225620 A 10/2010
JP 2015-035572 A 2/2015
(Continued)

OTHER PUBLICATIONS

International Search Report for International Application No. PCT/JP2016/076753, dated Nov. 29, 2016.
(Continued)

*Primary Examiner* — Hung S. Bui
(74) *Attorney, Agent, or Firm* — Pearne & Gordon LLP

(57) ABSTRACT

A high-frequency module 1a includes: a wiring substrate 2; a plurality of components 3a and 3b that are mounted on an upper surface 2a of the wiring substrate 2; a sealing resin layer 4 that is stacked on the upper surface 2a of the wiring substrate 2; a shield film 6 that covers a surface of the sealing resin layer 4; and a shield wall 5 that is provided in the sealing resin layer 4. The shield wall 5 is formed of two shield wall element bodies 5a and 5b that have straight line shapes in a plan view, and the two shield wall element bodies 5a and 5b are arranged such that the shield wall element bodies each have one end surface that is not exposed at a different peripheral side surface 4b of the sealing resin layer 4.

18 Claims, 6 Drawing Sheets

(51) Int. Cl.
*H01L 23/28* (2006.01)
*H01L 25/04* (2014.01)
*H01L 23/00* (2006.01)
*H01L 23/552* (2006.01)
*H05K 1/02* (2006.01)
*H01L 25/18* (2006.01)
*H01L 25/065* (2006.01)
*H01L 25/16* (2006.01)
*H05K 1/18* (2006.01)
*H05K 3/28* (2006.01)

(52) U.S. Cl.
CPC .............. *H01L 24/82* (2013.01); *H01L 25/04* (2013.01); *H05K 1/0216* (2013.01); *H05K 9/0022* (2013.01); *H05K 9/0081* (2013.01); *H05K 9/0084* (2013.01); *H01L 24/16* (2013.01); *H01L 25/0655* (2013.01); *H01L 25/16* (2013.01); *H01L 25/18* (2013.01); *H01L 2224/16225* (2013.01); *H01L 2924/00014* (2013.01); *H01L 2924/09701* (2013.01); *H01L 2924/10253* (2013.01); *H01L 2924/10329* (2013.01); *H01L 2924/15192* (2013.01); *H01L 2924/15313* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01); *H05K 1/0243* (2013.01); *H05K 1/0298* (2013.01); *H05K 1/181* (2013.01); *H05K 3/284* (2013.01); *H05K 2201/09972* (2013.01); *H05K 2203/1322* (2013.01)

(58) Field of Classification Search
USPC .......................................... 361/816, 818, 760
See application file for complete search history.

(56) References Cited

U.S. PATENT DOCUMENTS

| | | | |
|---|---|---|---|
| 9,055,682 B2* | 6/2015 | Mugiya | H05K 7/06 |
| 9,433,117 B1* | 8/2016 | Chun | H01L 23/49811 |
| 2006/0258050 A1 | 11/2006 | Fujiwara et al. | |
| 2012/0000699 A1 | 1/2012 | Inoue | |
| 2015/0016066 A1 | 1/2015 | Shimamura et al. | |
| 2015/0043170 A1 | 2/2015 | Shimamura et al. | |
| 2015/0043172 A1* | 2/2015 | Mugiya | H05K 1/0218 361/728 |
| 2015/0119102 A1 | 4/2015 | Saji et al. | |

FOREIGN PATENT DOCUMENTS

| | | |
|---|---|---|
| JP | 2015-057802 A | 3/2015 |
| JP | 2015-111803 A | 6/2015 |
| WO | 2005/099331 A1 | 10/2005 |

OTHER PUBLICATIONS

Written Opinion for International Application No. PCT/JP2016/076753, dated Nov. 29, 2016.

* cited by examiner

HIGH-FREQUENCY MODULE

This is a continuation of International Application No. PCT/JP2016/076753 filed on Sep. 12, 2016 which claims priority from Japanese Patent Application No. 2015-180971 filed on Sep. 14, 2015. The contents of these applications are incorporated herein by reference in their entireties.

BACKGROUND OF THE DISCLOSURE

Field of the Disclosure

The present disclosure relates to a high-frequency module that includes a sealing resin layer that covers a plurality of components mounted on a wiring substrate, and a shield layer that is for preventing the electromagnetic wave interference between the components.

Description of the Related Art

A shield layer is provided in a high-frequency module installed in a mobile terminal device or the like in order to block electromagnetic waves. Among high-frequency modules of this type, there are high-frequency modules in which components mounted on a wiring substrate are covered by a molding resin and a shield layer is provided so as to cover the surface of the molding resin.

Although the shield layer is provided in order to block electromagnetic waves from the outside as described above, in the case where a plurality of components are mounted on a wiring substrate, there is a problem in that electromagnetic waves generated by these components may interfere with other components. Accordingly, heretofore, a high-frequency module has been proposed that is provided with a shield layer that blocks not only electromagnetic waves from the outside but also electromagnetic waves between mounted components.

For example, as illustrated in FIG. 10, in a high-frequency module 100 disclosed in Patent Document 1, two components 102 are mounted on a wiring substrate 101, and both of the components 102 are sealed with a molding resin layer 103. A slit S that penetrates through the molding resin layer 103 is formed in the molding resin layer 103 between the two components. A shield layer 104 is formed of a conductive paste that covers the surface of the molding resin layer 103 and fills the slit S. In addition, the conductive paste that fills the slit S is electrically connected to a ground electrode 105 that is formed on the wiring substrate 101.

In this case, the components 102 can be shielded from electromagnetic waves from the outside by the conductive paste that covers the surface of the molding resin layer 103. In addition, the electromagnetic wave interference between the two components can be prevented by the conductive paste filling the slit S.

Patent Document 1: Japanese Unexamined Patent Application Publication No. 2010-225620 (refer to paragraphs 0025-0026 and FIG. 1, for example)

BRIEF SUMMARY OF THE DISCLOSURE

In recent years, with the decreasing size and increasing functionality of high-frequency modules, there has been a demand for the mounting surface of a wiring substrate to be used in a non-wasteful manner by dividing a sealing resin layer into a plurality of regions using a shield wall and then arranging components in the individual regions. However, the slit S disclosed in Patent Document 1 is formed using a method in which a groove is formed in the molding resin layer 103 and then the groove is filled with a conductive paste, and since the molding resin layer 103 is divided by this groove, there is a problem in that the wiring substrate may crack or warp due to the heat or stress generated when the high-frequency module is used.

The present disclosure was made in light of the above-described problem, and an object thereof is to provide a high-frequency module that can reduce the occurrence of the cracking or warping of a wiring substrate while improving shielding performance between mounted components.

In order to achieve the above-described object, a high-frequency module of the present disclosure includes: a wiring substrate; a plurality of components that are mounted on a main surface of the wiring substrate; a sealing resin layer that is stacked on the main surface of the wiring substrate and seals the plurality of components; and a shield wall that is provided in the sealing resin layer and is arranged so as to partition the sealing resin layer into a plurality of regions in which prescribed components are respectively mounted. The shield wall includes a plurality of shield wall element bodies that each have at least one end portion that is not exposed at a side surface of the sealing resin layer.

In this case, the shield wall arranged between the components has at least one end surface that is not exposed at a peripheral side surface of the sealing resin layer, and therefore the sealing resin layer is not divided by the shield wall and has a continuous structure. Therefore, it is possible to reduce the occurrence of the cracking or warping of the wiring substrate that is caused by the heat or stress generated when the high-frequency module is used.

In addition, when one of the two regions partitioned by the shield wall is viewed from another of the two regions, at least a part of one shield wall element body, which is different from another shield wall element body, may be arranged in a place where the other shield wall element body is not arranged. In this case, the interference between the components caused by electromagnetic waves can be reduced while reducing the occurrence of the cracking or warping of the wiring substrate caused by the heat or stress generated when the high-frequency module is used.

The plurality of shield wall element bodies may be each arranged so as to be parallel to each other in at least a part thereof. In this case, a shield wall can be provided in which the shield wall element bodies are arranged parallel to each other.

The plurality of shield wall element bodies may be arranged so as to surround at least one region such that the region has an island shape. In this case, the occurrence of the cracking or warping of a wiring substrate caused by the heat or stress generated when the high-frequency module is used can be reduced in a configuration in which the shield wall surrounds one region of the wiring substrate such that the region has an island shape.

In addition, at least one region other than the island-shaped region may be partitioned by the plurality of shield wall element bodies. In this case, the divided regions having complex shapes can be arranged on the wiring substrate.

Furthermore, the high-frequency module may further include: a shield film that covers a surface of the sealing resin layer except for the island-shaped region. In this case, a component that is not to be shielded from electromagnetic waves can be arranged in the part corresponding to the island-shaped region. In addition, electromagnetic waves from the top surface of the island-shaped region can be prevented from affecting a component mounted in a region other than the island-shaped region.

The high-frequency module may further include: a ground electrode that is arranged inside the wiring substrate and outside the island-shaped region; and a via that connects the shield wall and the ground electrode to each other. In this case, the shield film, the shield wall, and the ground electrode are arranged so as to surround a component in a region other than the island-shaped region, and therefore the shielding performance between a component mounted in the island-shaped region and a component mounted in the region other than the island-shaped region can be improved.

In addition, the high-frequency module may further include: a surface layer conductor that is arranged on the main surface of the wiring substrate so as to contact each shield wall element body. In this case, since the surface area of the surface layer conductor on the main surface is increased, the heat from a laser that is used when forming grooves is more easily released. In addition, it is possible to use a common via conductor.

Furthermore, the high-frequency module may further include: at least one surface layer conductor being arranged so as to contact the plurality of shield wall element bodies. In this case, the shielding characteristics of all the shield wall element bodies can be improved by connecting the surface layer conductor to a ground electrode, which is for realizing grounding.

According to the present disclosure, the shield wall that is arranged between components has at least one end surface that is not exposed at the peripheral side surface of the sealing resin layer, and therefore the sealing resin layer is not divided by the shield wall and has a continuous structure, and the occurrence of the cracking or warping of the wiring substrate caused by the heat or stress generated when the high-frequency module is used can be reduced.

BRIEF DESCRIPTION OF THE SEVERAL VIEWS OF THE DRAWINGS

Each of FIGS. 1A, 1B and 1C is a diagram illustrating a high-frequency module according to a first embodiment of the present disclosure.

Figure 4A:
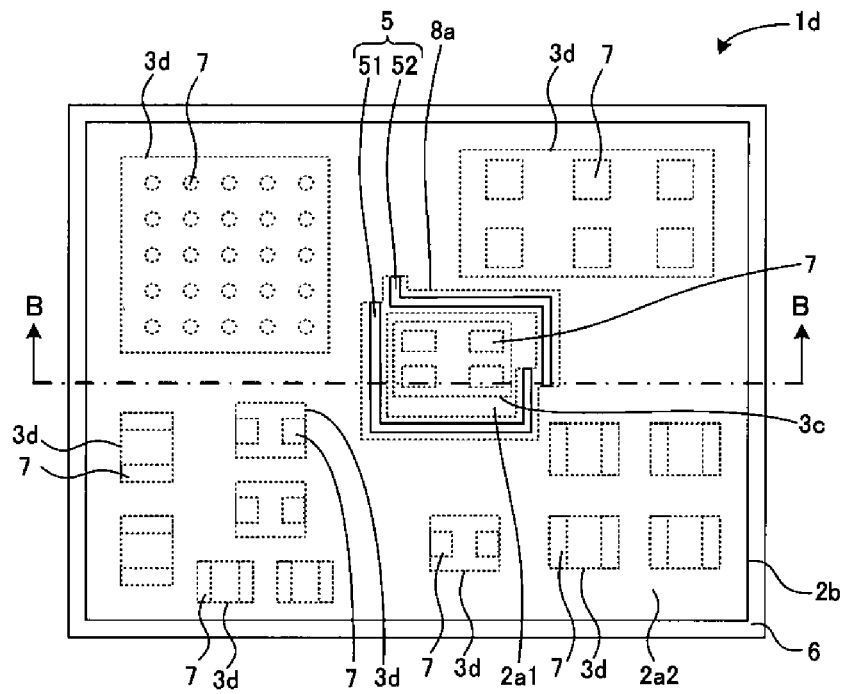
Figure 4B:
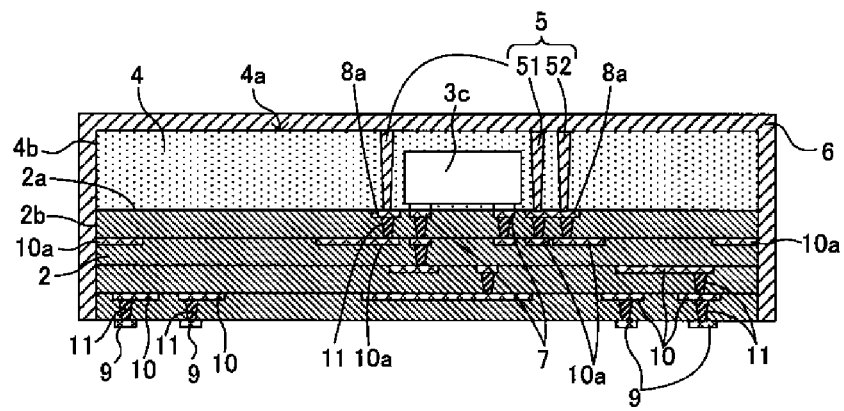

Each of FIGS. 4A and 4B is a diagram illustrating a high-frequency module according to a second embodiment of the present disclosure.

Figure 5:
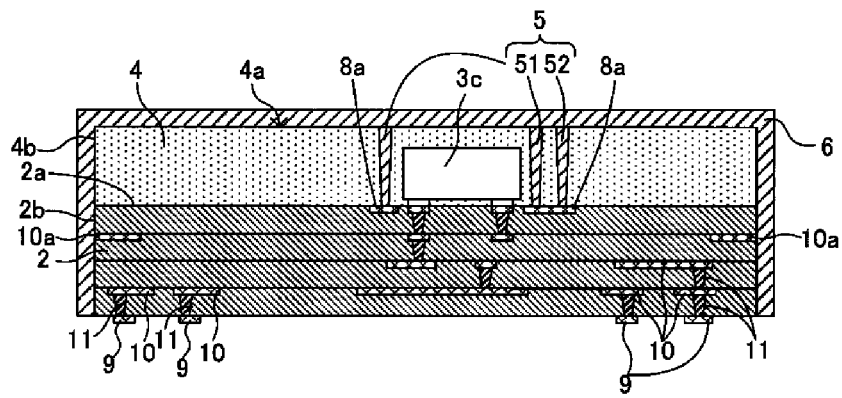

FIG. 5 is a diagram illustrating a modification of the arrangement of electrodes in FIGS. 4A and 4B.

Figure 6:
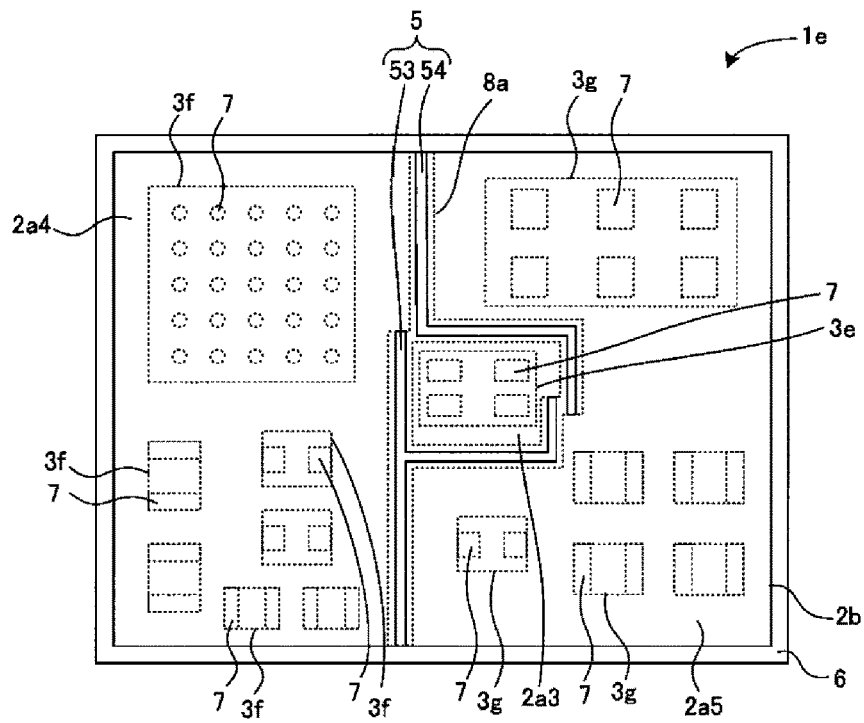

FIG. 6 is a diagram illustrating a modification of a shield wall in FIGS. 4A and 4B.

Figure 7:
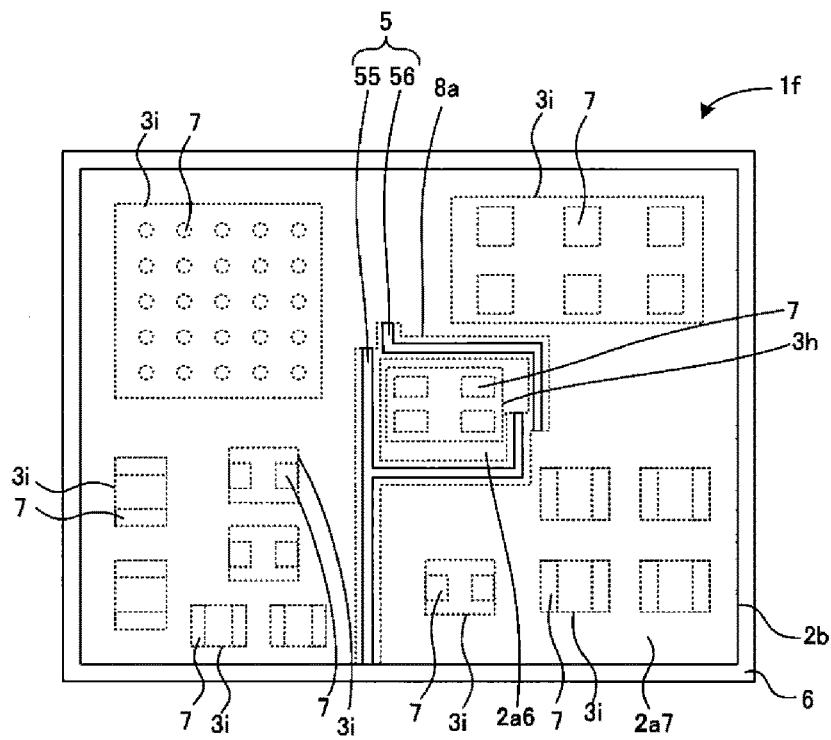

FIG. 7 is a diagram illustrating another modification of the shield wall in FIGS. 4A and 4B.

Figure 8:
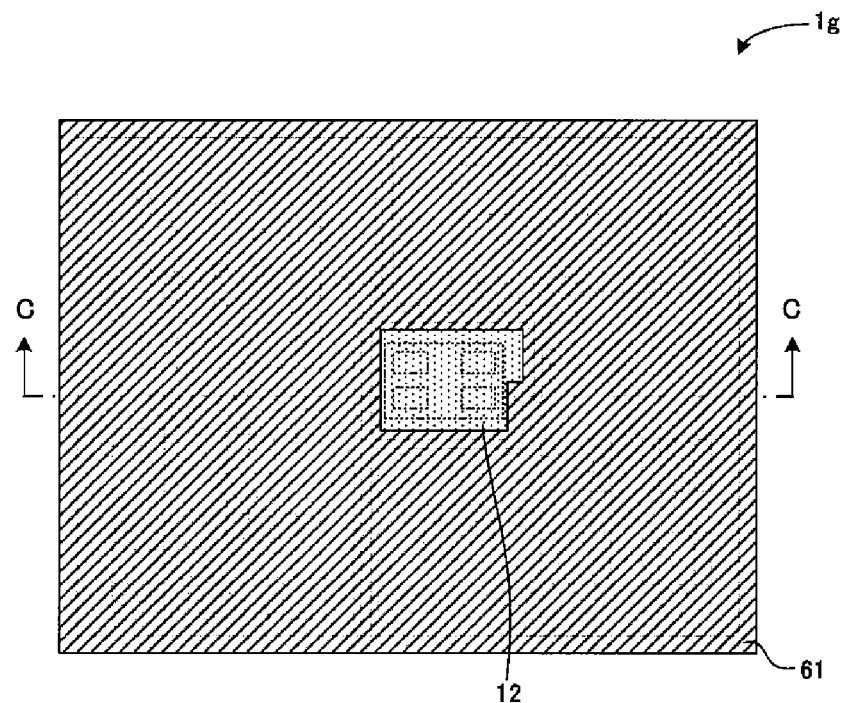

FIG. 8 is a plan view of a high-frequency module according to a third embodiment of the present disclosure.

Figure 9:
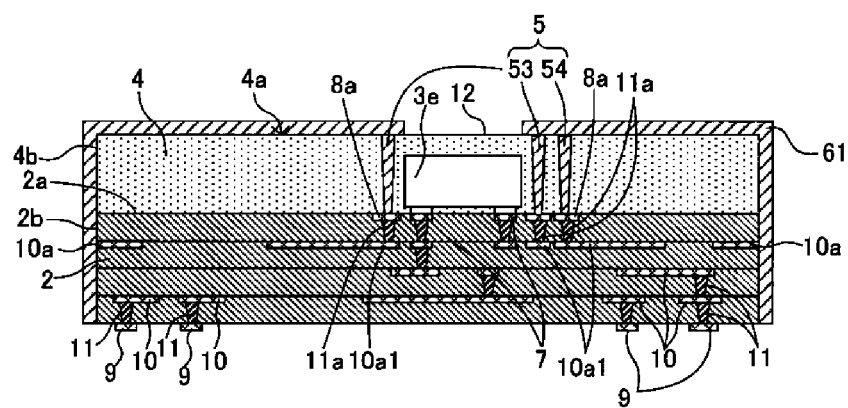

FIG. 9 is a sectional view taken along C-C in FIG. 8 and looking in the direction of the arrows.

Figure 10:
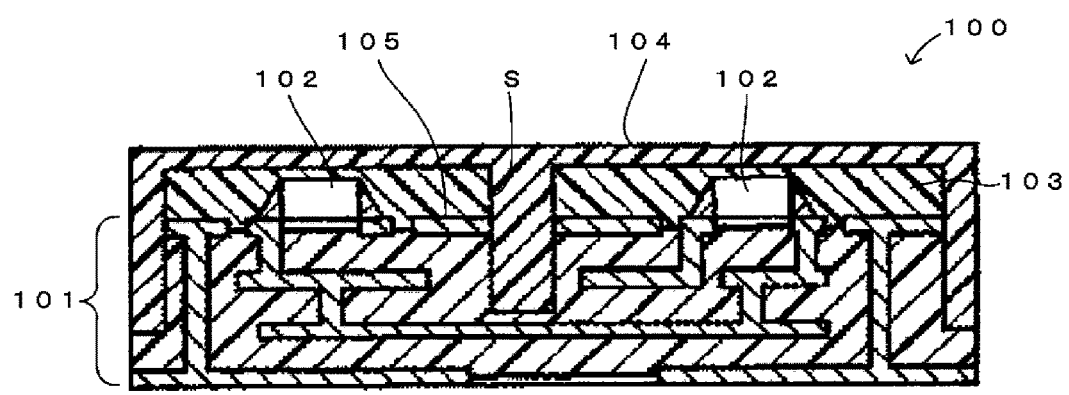

FIG. 10 is a sectional view illustrating a high-frequency module of the related art.

DETAILED DESCRIPTION OF THE DISCLOSURE

First Embodiment

Figure 1A:
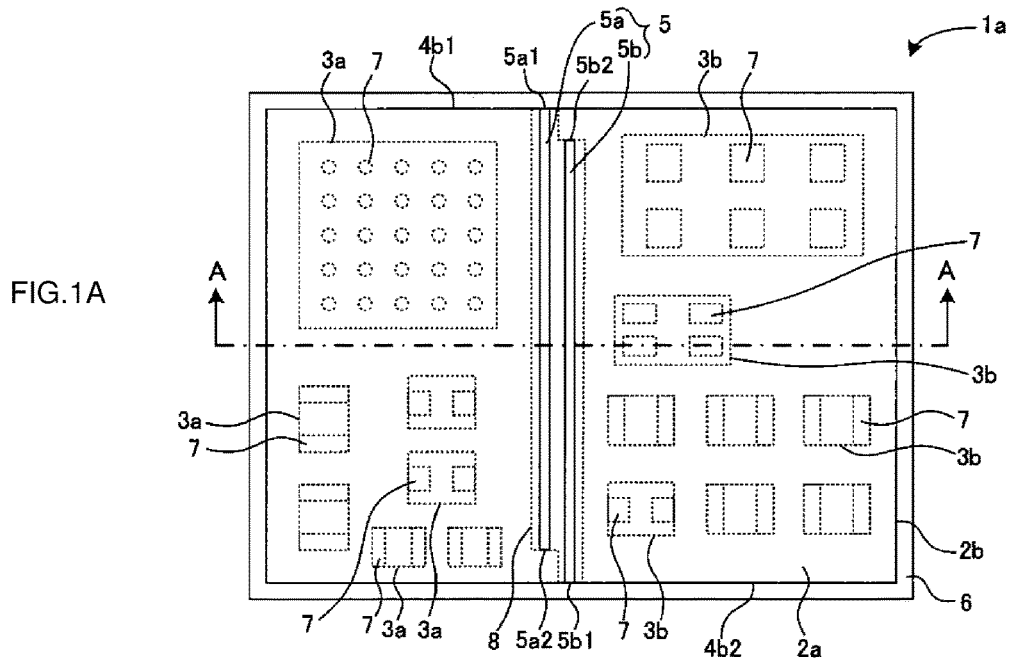
Figure 1B:
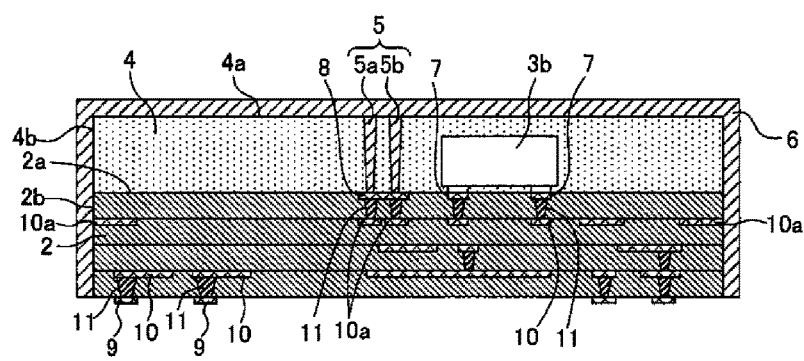
Figure 1C:
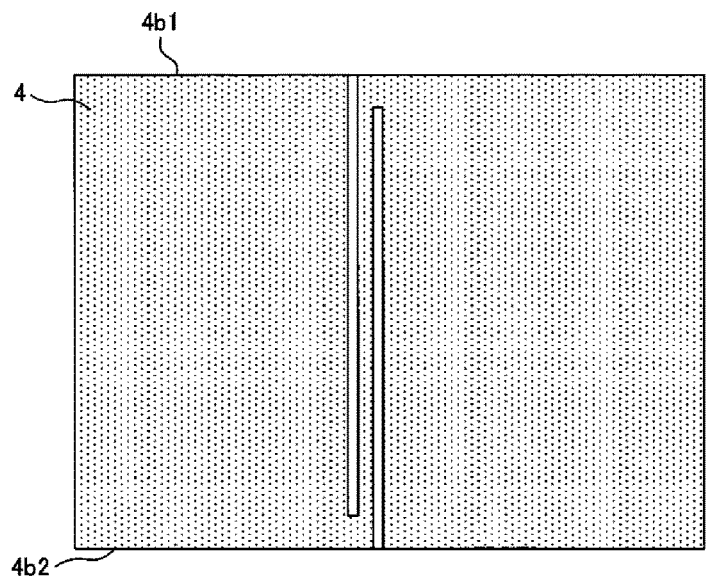

A high-frequency module 1a according to a first embodiment of the present disclosure will be described while referring to FIGS. 1A, 1B and 1C. FIG. 1A is a plan view of the high-frequency module 1a, FIG. 1B is a sectional view taken along A-A in FIG. 1A and looking in the direction of the arrows, and FIG. 1C is a plan view of a sealing resin layer 4. In addition, a top surface part of a shield film 6 is not illustrated in FIGS. 1A, 1B and 1C.

As illustrated in FIGS. 1A, 1B and 1C, the high-frequency module 1a according to this embodiment includes a wiring substrate 2, a plurality of components 3a and 3b that are mounted on an upper surface 2a (corresponding to "a main surface of the wiring substrate" of the present disclosure) of the wiring substrate 2, a sealing resin layer 4 that is stacked on the upper surface 2a of the wiring substrate 2, a shield film 6 that covers a surface of the sealing resin layer 4, and a shield wall 5 that is provided in the sealing resin layer 4. The high-frequency module 1a is, for example, mounted on a motherboard or the like of an electronic appliance that uses high-frequency signals.

The wiring substrate 2 is, for example, formed of a low-temperature co-fired ceramic, a glass epoxy resin or the like, mounting electrodes 7 for mounting the components 3a and 3b and a surface layer conductor 8 are formed on the upper surface 2a of the wiring substrate 2, and outer electrodes 9 that are for realizing external connections are formed on a lower surface 2c of the wiring substrate 2. In addition, in this embodiment, the wiring substrate 2 has a multilayer structure, and wiring electrodes 10, a ground electrode 10a, and via conductors 11 are formed inside the wiring substrate 2.

The mounting electrodes 7, the surface layer conductor 8, the outer electrodes 9, the wiring electrodes 10, and the ground electrode 10a are formed of a metal typically employed for wiring electrodes such as Cu, Ag, or Al. In addition, the via conductors 11 are formed of a metal such as Ag or Cu. The mounting electrodes 7, the surface layer conductor 8, and the outer electrodes 9 may be subjected to Ni and Au plating. In addition, a metal member that protects the surface layer conductor 8 which is a solder film or the like may be bonded to the surface layer conductor 8.

The components 3a and 3b are each formed of a semiconductor element formed of a semiconductor such as Si or GaAs, or a chip component such as a chip inductor, a chip capacitor, or a chip resistor.

The sealing resin layer 4 is stacked on the wiring substrate 2 so as to cover the upper surface 2a of the wiring substrate 2 and the components 3a and 3b. The sealing resin layer 4 can be formed of a resin that is typically employed as a sealing resin such as an epoxy resin.

The shield film 6 is for shielding the various wiring electrodes 10 and the ground electrode 10a inside the wiring substrate 2 and the components 3a and 3b from electromagnetic waves from the outside, and is stacked on the sealing resin layer 4 so as to cover an upper surface 4a (surface on the opposite side from upper surface 2a of wiring substrate 2) and peripheral side surfaces 4b of the sealing resin layer 4, and side surfaces 2b of the wiring substrate 2. The shield film 6 is electrically connected to the ground electrode 10a, which is exposed at the side surfaces 2b of the wiring substrate 2.

Furthermore, the shield film 6 can be formed so as to have a multilayer structure consisting of an adhesive film that is stacked on the surface of the sealing resin layer 4, a conductive film that is stacked on the adhesive film, and a protective film that is stacked on the conductive film.

The adhesive film is provided in order to increase the adhesive strength between the conductive film and the sealing resin layer 4, and can be formed of a metal such as stainless steel, for example. The adhesive film may be formed of Ti, Cr, Ni, TiAl or the like. The conductive film is a layer that substantially realizes the shielding function of the shield film 6, and can be formed of any metal from among Cu, Ag, and Al, for example. The protective film is provided in order to prevent the corrosion of and damage to the conductive film, and can be formed of stainless steel, for example. The protective film may be formed of Ti, Cr, Ni, TiAl or the like.

The shield wall 5 is for preventing the electromagnetic wave interference between the components 3a and 3b, and is arranged inside the sealing resin layer 4 and between the components 3a and 3b so as to partition the sealing resin layer 4 into two regions. In this embodiment, the shield wall 5 is formed of two shield wall element bodies 5a and 5b, which have a linear shape in a plan view, and as a result, the electromagnetic wave interference between the components 3a and 3b is prevented. In addition, the two shield wall element bodies 5a and 5b are arranged such that the shield wall element bodies 5a and 5b each have one end surface that is not exposed at a peripheral side surface 4b of the sealing resin layer 4.

Specifically, as illustrated in FIG. 1A, the two shield wall element bodies 5a and 5b are arranged substantially parallel to each other between the components 3a and 3b with a spacing therebetween of such a size that the wall surfaces thereof do not touch each other. In this case, one end surface 5a1 of one shield wall element body 5a is exposed at one peripheral side surface 4b1 out of two opposing sides of the sealing resin layer 4, which has a rectangular shape in a plan view, whereas another end surface 5a2 of the one shield wall element body 5a is formed so as to be not exposed at a peripheral side surface 4b2 on the other side of the sealing resin layer 4. In addition, one end surface 5b1 of the other shield wall element body 5b is exposed at the other peripheral side surface 4b2 of the sealing resin layer 4, whereas another end surface 5b2 of the other shield wall element body 5b is formed so as not to be exposed at the one peripheral side surface 4b1 of the sealing resin layer 4, and the two shield wall element bodies 5a and 5b are arranged so as to partially overlap when viewed in a direction parallel to the upper surface 2a of the wiring substrate 2. In other words, when looking from one of the two regions of the sealing resin layer 4 partitioned by the shield wall 5 at the other of the two regions, a part of the other shield wall element body 5b is arranged in a place where the one shield wall element body 5a is not arranged. In addition, when looking from one of the two regions of the sealing resin layer 4 partitioned by the shield wall 5 at the other of the two regions, a part of the one shield wall element body 5a is arranged in a place where the other shield wall element body 5b is not arranged. In other words, the two shield wall element bodies 5a and 5b are able to support each other in the places where the shield wall element bodies 5a and 5b cannot provide shielding.

As a result of the shield wall 5 being formed of the two shield wall element bodies 5a and 5b in this way, as illustrated in FIG. 1C, the sealing resin layer 4 is not completely divided by one shield wall and has a structure that is continuous between the two shield wall element bodies 5a and 5b. The upper end surfaces of the two shield wall element bodies 5a and 5b are both electrically connected to the top surface of the shield film 6.

The surface layer conductor 8 is arranged between the upper surface 2a of the wiring substrate 2 and the two shield wall element bodies 5a and 5b at a position that is superposed with both the shield wall element bodies 5a and 5b in a plan view. In this embodiment, as illustrated in FIG. 1A, the surface layer conductor 8 is formed such that two band-shaped electrodes, which are respectively wider than the two shield wall element bodies 5a and 5b, are connected and integrated with each other, and the two shield wall element bodies 5a and 5b both contact and are electrically connected to the same surface layer conductor 8 on the upper surface 2a of the wiring substrate 2.

(Method of Manufacturing High-Frequency Module)

Next, a method of manufacturing the high-frequency module 1a will be described. First, the wiring substrate 2, which has the mounting electrodes 7, the surface layer conductor 8, the outer electrodes 9, the wiring electrodes 10, the ground electrode 10a, and the via conductors 11 formed thereon and therein, is prepared, and then the components 3a and 3b are mounted on the upper surface 2a of the wiring substrate 2 using a known surface mount technology such as solder mounting.

Next, the sealing resin layer 4 is stacked on the upper surface 2a of the wiring substrate 2 so as to cover the components 3a and 3b. The sealing resin layer 4 can be formed using a coating method, a printing method, a transfer molding method, a compression molding method, or the like.

Next, the surface of the sealing resin layer 4 is subjected to polishing or grinding in order to make the upper surface 4a of the sealing resin layer 4 flat.

Next, grooves are formed in the sealing resin layer 4 at the places where the two shield wall element bodies 5a and 5b will be arranged by irradiating the sealing resin layer 4 with laser light at these places from the upper surface 4a side. At this time, the grooves are formed to have a depth such that the surface layer conductor 8 is exposed therethrough and such that one end of each groove is not exposed at different peripheral side surfaces 4b of the sealing resin layer 4. As a result the grooves being formed in this way, the sealing resin layer 4 is not divided and instead has a continuous structure. The grooves may alternatively be formed using drill processing rather than laser processing.

Next, the two shield wall element bodies 5a and 5b are formed by filling the grooves formed in the sealing resin layer 4 with a conductive paste containing a Cu filler for example, using a coating method, a printing method, or the like.

The two shield wall element bodies 5a and 5b are for example formed of a conductive paste containing a metal filler such as Cu, Ag or Al. The two shield wall element bodies 5a and 5b may alternatively be formed by forming grooves for the two shield wall element bodies 5a and 5b in the sealing resin layer 4 by using laser processing or the like and then depositing a metal in the grooves by using a film deposition technique such as sputtering.

Next, the shield film 6 is deposited so as to cover the surfaces of the sealing resin layer 4 (upper surface 4a and peripheral side surfaces 4b) and the side surfaces 2b of the wiring substrate 2 using a sputtering device or a vacuum vapor deposition device, and the high-frequency module 1a is thus completed. The two shield wall element bodies 5a and 5b may be formed using the same film deposition technique as the shield film 6. In this case, it is sufficient that the grooves of the two shield wall element bodies 5a and 5b be buried when the shield film 6 is deposited.

Therefore, according to the above-described embodiment, the two shield wall element bodies 5a and 5b, which form the shield wall 5, are arranged such that the shield wall element bodies 5a and 5b each have one end that is not exposed at a different peripheral side surface 4b of the sealing resin layer 4, and the sealing resin layer 4 is not completely divided by the two shield wall element bodies 5a and 5b, which are arranged so as to be spaced apart from each other, and instead has a structure that is continuous between the two shield wall element bodies 5a and 5b, and therefore the occurrence of the cracking or warping of the wiring substrate 2 caused by the heat or stress generated when the high-frequency module 1a is used can be reduced. In addition, when viewed in a direction parallel to the upper surface 2a of the wiring substrate 2, the two shield wall element bodies 5a and 5b partially overlap each other, and the electromagnetic wave interference between the two components 3a and 3b, which are arranged with the shield wall 5 interposed therebetween, can be prevented by this overlapping part.

Furthermore, since one surface layer conductor 8 is shared by the two shield wall element bodies 5a and 5b, the heat generated during the laser processing performed when forming the grooves for the shield wall element bodies in the sealing resin layer 4 is more easily released due to the surface area of the surface layer conductor 8 at the upper surface 2a of wiring substrate 2 being larger than in the case where the shield wall element bodies respectively contact different surface layer conductors. In addition, since the surface layer conductor 8 is connected to a plurality of shield wall element bodies, a common via conductor 11 may be used when connecting the two shield wall element bodies 5a and 5b to the ground electrode 10a, and the degree of freedom of design when deciding upon the arrangement of wiring electrodes on the upper surface 2a of the wiring substrate 2 can be improved.

(Modifications of Shield Wall Element Bodies)

Figure 2:
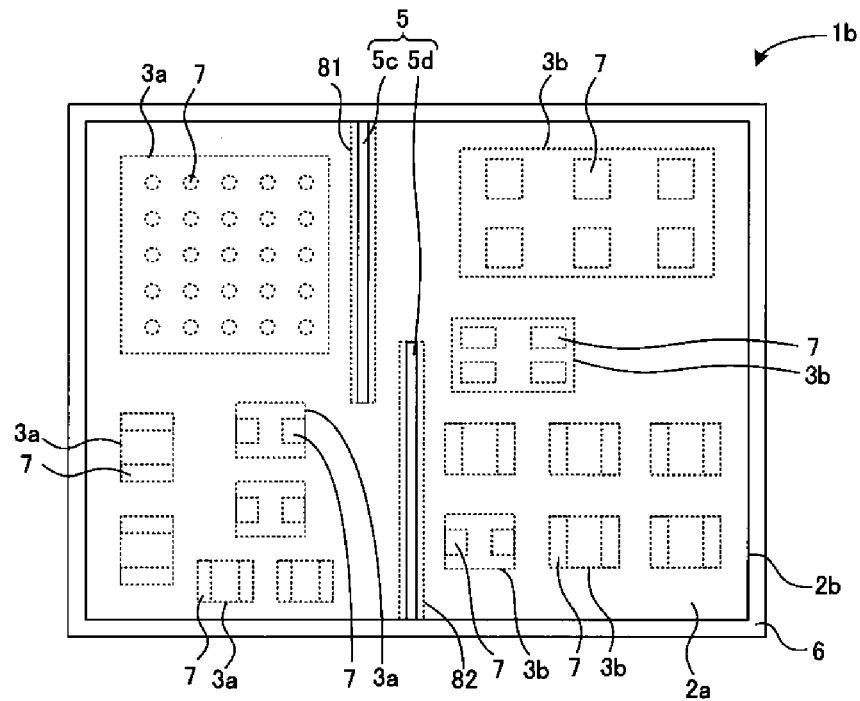
FIG. 2 is a diagram illustrating a modification of a shield wall in FIGS. 1A, 1B and 1C.
Figure 3:
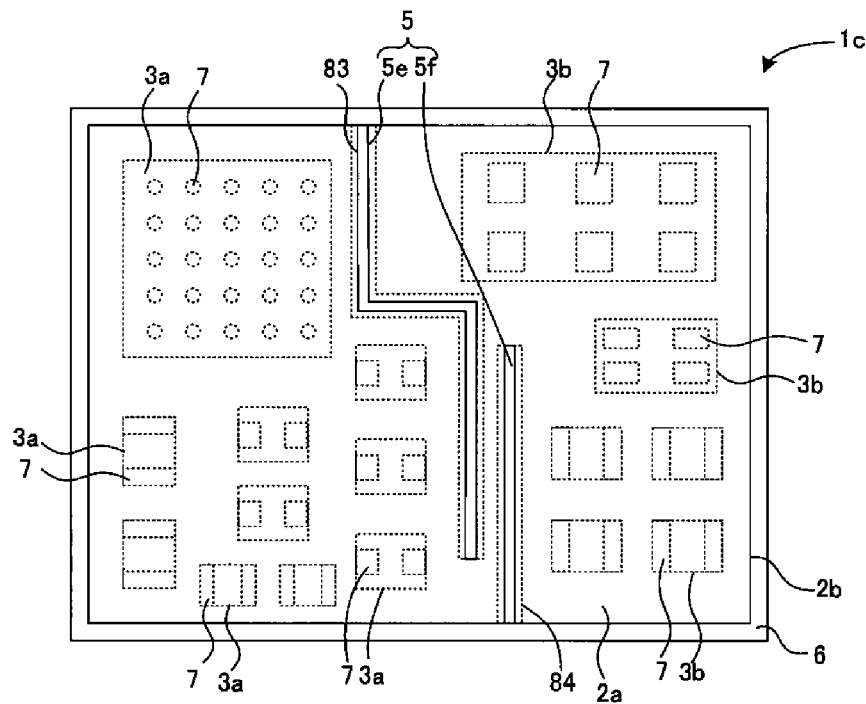
FIG. 3 is a diagram illustrating another modification of the shield wall in FIGS. 1A, 1B and 1C.

Modifications of the two shield wall element bodies 5a and 5b will be described while referring to FIGS. 2 and 3. FIGS. 2 and 3 are diagrams illustrating modifications of the shield wall element bodies 5a and 5b, and are diagrams that correspond to FIG. 1A.

The shapes and arrangements of the two shield wall element bodies 5a and 5b can be modified, as appropriate. For example, as illustrated in the plan view of a high-frequency module 1b in FIG. 2, the parts of two shield wall element bodies 5c and 5d that overlap each other when viewed in a direction parallel to the upper surface 2a of the wiring substrate 2 may be made smaller than in the case illustrated in FIGS. 1A, 1B and 1C. In addition, as illustrated in FIG. 2, the two shield wall element bodies 5c and 5d may be respectively connected to different surface layer conductors 81 and 82.

Furthermore, as illustrated in the plan view of a high-frequency module 1c in FIG. 3, a shield wall element body 5e may be bent. In addition, two shield wall element bodies 5e and 5f may be respectively connected to different surface layer conductors 83 and 84.

Thus, by appropriately modifying the shapes and arrangements of the shield wall element bodies, the degree of freedom of design when deciding upon the arrangement of the components 3a and 3b is improved, and in addition, it becomes easier to reduce the size of the high-frequency module.

Second Embodiment

A high-frequency module 1d according to a second embodiment of the present disclosure will be described while referring to FIGS. 4A and 4B. FIG. 4A is a plan view of the high-frequency module 1d, and FIG. 4B is a sectional view taken along B-B in FIG. 4A and looking in the direction of the arrows. In addition, a top surface part of the shield film 6 is not illustrated in FIG. 4A.

The high-frequency module 1d according to this embodiment differs from the high-frequency module 1a of the first embodiment described while referring to FIGS. 1A, 1B and 1C in that the area of the upper surface 2a of the wiring substrate 2 is partitioned into one central island-shaped region 2a1 and a remaining region 2a2 by a shield wall element body 51 that is substantially U-shaped in a plan view and a shield wall element body 52 that is substantially L-shaped in a plan view. The rest of the configuration is the same as that of the high-frequency module 1a of the first embodiment and therefore the same symbols are used and the description thereof is omitted.

In this embodiment, the electromagnetic wave interference between components 3c, which are mounted in the island-shaped region 2a1 of the upper surface 2a of the wiring substrate 2 and components 3d, which are mounted in the remaining region 2a2 of the upper surface 2a of the wiring substrate 2, is prevented by forming the shield wall 5 from the two shield wall element bodies 51 and 52 as described above. In addition, the two shield wall element bodies 51 and 52 are each arranged such that neither of the end surfaces thereof is exposed at the peripheral side surfaces 4b of the sealing resin layer 4.

In this case, the two shield wall element bodies 51 and 52 are arranged so as to surround the island-shaped region 2a1 of the upper surface 2a of the wiring substrate 2, and the two shield wall element bodies 51 and 52 are arranged so as to almost completely overlap when viewed in a direction parallel to the upper surface 2a of the wiring substrate 2. Here, the two shield wall element bodies 51 and 52 are arranged with a prescribed spacing therebetween such that the parts of the shield wall element bodies 51 and 52 that are closest to each other do not touch. By arranging the two shield wall element bodies 51 and 52 in this way, the shield wall 5 is shaped so as to surround the island-shaped region 2a1, and the components 3c, which are mounted in the island-shaped region 2a1, are separated by the shield wall 5 from the components 3d, which are mounted in the region 2a2, which is outside the island-shaped region 2a1.

In addition, as illustrated in FIG. 4B, the two shield wall element bodies 51 and 52 are electrically connected to a surface layer conductor 8a, and are connected to the ground electrode 10a via the via conductors 11.

According to this embodiment, the shield wall 5 is formed of the two shield wall element bodies 51 and 52, neither of the end surfaces of each of which is exposed at the side surfaces 4b of the sealing resin layer 4. Further, the sealing resin layer 4 is not divided but rather has a continuous structure. Therefore, the occurrence of the cracking or warping of the wiring substrate 2 caused by the heat or stress when the high-frequency module 1d is used can be reduced. In addition, a component mounting region having increased shielding performance can be secured as a result of the components 3c, which are mounted in the island-shaped region 2a1, being surrounded by the shield wall 5.

(Modification of Electrode Arrangement)

As a modification of the second embodiment, as illustrated in FIG. 5, the two shield wall element bodies 51 and 52 do not have to be connected to the ground electrode 10a from the surface layer conductor 8a.

(Modifications of Shield Wall Element Bodies)

FIGS. 4A, 4B and 5 illustrate examples in which the two shield wall element bodies 51 and 52 are arranged so as to surround the island-shaped region 2a1 of the upper surface 2a of the wiring substrate 2. However, as illustrated in FIG.

6, in a high-frequency module 1e, a shield wall 5 may alternatively be formed of a shield wall element body 53 having a shape obtained by arranging an L shape partway along a straight line in a plan view and a shield wall element body 54 having a shape obtained by arranging L shapes in a continuous manner at the ends of a straight line in a plan view. The shield wall element bodies 53 and 54 may be arranged such that a substantially central part of the upper surface 2a of the wiring substrate 2 is surrounded by the two shield wall element bodies 53 and 54 in the form of an island-shaped region, and so as to partition the upper surface 2a of the wiring substrate 2 into an island-shaped region 2a3, and so as to further partition the region outside the island-shaped region 2a3 into two regions, namely, a region 2a4 and a region 2a5. In this case, the two shield wall element bodies 53 and 54 are arranged such that the parts of the shield wall element bodies 53 and 54 that are closest to each other do not touch.

In addition, as illustrated in FIG. 7, in a high-frequency module 1f, the shield wall 5 may be formed of a shield wall element body 55 having the same shape as the shield wall element body 53 in FIG. 6 and a shield wall element body 56 having the same shape as the shield wall element body 52 in FIG. 4A, and a part of a region 2a7, which is a region of the upper surface 2a of the wiring substrate 2 other than an island-shaped region 2a6, may be partitioned by the shield wall element body 55 or 56. In this case, since the complex-shaped divided regions 2a6 and 2a7 can be formed on the wiring substrate 2, the degree of freedom in arranging components 3e to 3i, which are mounted in the regions 2a6 and 2a7, can be improved, and a component mounting region having increased shielding performance can be secured.

Third Embodiment

A high-frequency module 1g according to a third embodiment of the present disclosure will be described while referring to FIG. 8. FIG. 8 is a plan view of the high-frequency module 1g, and is a diagram corresponding to each of FIGS. 4A and 4B.

The high-frequency module 1g according to this embodiment differs from the high-frequency module 1e of the modification of the second embodiment described while referring to FIG. 6 in that, as illustrated in FIG. 8, the upper surface 4a and the peripheral side surfaces 4b of the sealing resin layer 4 and the side surfaces 2b of the wiring substrate 2 are covered by a shield film 61 having an opening 12 in a part thereof that is superposed in a plan view with the island-shaped region 2a3. The rest of the configuration is the same as that of the high-frequency module 1e, and therefore the same symbols are used and the description thereof is omitted.

Furthermore, as illustrated in FIG. 9, a ground electrode 10a1 that is arranged outside the island-shaped region 2a3 of the upper surface 2a of the wiring substrate 2 in a plan view, and via conductors 11a that connect the two shield wall element bodies 53 and 54 and the ground electrode 10a1 to each other are additionally provided inside the wiring substrate 2.

The two shield wall element bodies 53 and 54 in FIG. 8 have the same shapes and arrangements as illustrated in FIG. 6, but may alternatively have the same shapes and arrangements as the shield wall element bodies in FIG. 4A and FIG. 7.

Thus, as a result of providing the opening 12 in the shield film 61, the components 3e, which are mounted in the island-shaped region 2a3, are exposed to electromagnetic waves from the outside. Therefore, the components 3e, which do not need to be shielded from electromagnetic waves from the outside, can be mounted in the island-shaped region 2a3. On the other hand, the regions 2a4 and 2a5 of the wiring substrate 2, which are regions of the wiring substrate 2 other than the island-shaped region 2a3, are shielded from electromagnetic waves from the outside by the shield film 61 and the two shield wall element bodies 53 and 54, and therefore the components 3f and 3g, which do need to be shielded from electromagnetic waves from the outside, can be mounted in the regions 2a4 and 2a5. Thus, the components 3f and 3g, which need to be shielded from electromagnetic waves from the outside, and the components 3e, which do not need to be shielded from electromagnetic waves from the outside, can be mounted on the upper surface 2a of the same wiring substrate 2. Furthermore, electromagnetic waves from the opening 12 in the shield film 61 can be prevented from affecting the components 3f and 3g, which need to be shielded from electromagnetic waves from the outside, by the two shield wall element bodies 53 and 54, and therefore a component mounting region having increased shielding performance can be secured.

Furthermore, as illustrated in FIG. 9, since the shield film 61, the two shield wall element bodies 53 and 54, and the ground electrode 10a1 are arranged so as to surround the component 3f or 3g mounted in the region 2a4 or 2a5, both of which are regions other than the island-shaped region 2a3, in the case where the ground electrode 10a1 is arranged inside the wiring substrate 2 and outside the island-shaped region 2a3 and the two shield wall element bodies 53 and 54 and the ground electrode 10a1 are connected to each other by the via conductors 11a, the shielding performance with respect to the components 3f and 3g mounted in the regions 2a4 and 2a5, which are regions other than the island-shaped region 2a3, can be improved.

The present disclosure is not limited to the above-described embodiments and can be modified in various ways not described above so long as they do not depart from the gist of the disclosure. For example, the configurations of the embodiments and modifications described above may be combined with each other.

Although the shield wall 5 is formed of two shield wall element bodies in the embodiments described above, the shield wall 5 may instead be formed of three or more shield wall element bodies. In this case, a shield wall element body having two end surfaces that are not exposed at the peripheral side surfaces 4b of the sealing resin layer 4 may be included in the shield wall 5. In addition, there may be four or more regions within the sealing resin layer 4 partitioned by the shield wall 5.

In addition, the present disclosure can be applied to a variety of high-frequency modules that include a sealing resin layer that covers components mounted on a wiring substrate, and a shield wall that is for preventing the electromagnetic wave interference between the components.

1a to 1g high-frequency module
2 wiring substrate
3a to 3i component
4 sealing resin layer
5 shield wall
5a to 5d, 51 to 56 shield wall element body
6, 61 shield film
8 surface layer conductor
10 inner wiring electrode
11 via conductor
12 opening

The invention claimed is:

1. A high-frequency module comprising:
a wiring substrate;
a plurality of components mounted on a main surface of the wiring substrate;
a sealing resin layer stacked on the main surface of the wiring substrate and sealing the plurality of components; and
a shield wall provided in the sealing resin layer and arranged so as to partition the sealing resin layer into a plurality of regions, wherein at least one prescribed component is respectively mounted in each of the plurality of regions;
wherein the shield wall includes a plurality of shield wall element bodies, and each of the plurality of shield wall element bodies has at least one end portion not exposed at a side surface of the sealing resin layer.

2. The frequency module according to claim 1,
wherein the shield wall partitions the sealing resin layer into two regions, and wherein when one of the two regions partitioned by the shield wall is viewed from another one of the two regions, at least a part of one of the plurality of shield wall element bodies different from another one of the plurality of shield wall element bodies is arranged in a place where the other shield wall element body is not arranged.

3. The frequency module according to claim 2,
wherein the plurality of shield wall element bodies are each arranged so as to be parallel to each other in at least a part of each of the plurality of shield wall element bodies.

4. The frequency module according to claim 3,
wherein the plurality of shield wall element bodies are arranged so as to surround at least one region such that the at least one region has an island shape.

5. The frequency module according to claim 3, further comprising:
a surface layer conductor arranged on the main surface of the wiring substrate so as to contact each of the plurality of shield wall element bodies.

6. The frequency module according to claim 2,
wherein the plurality of shield wall element bodies are arranged so as to surround at least one region such that the at least one region has an island shape.

7. The frequency module according to claim 2, further comprising:
a surface layer conductor arranged on the main surface of the wiring substrate so as to contact each of the plurality of shield wall element bodies.

8. The frequency module according to claim 1,
wherein the plurality of shield wall element bodies are arranged so as to surround at least one region such that the at least one region has an island shape.

9. The frequency module according to claim 8,
wherein at least one region other than the island-shaped region is partitioned by the plurality of shield wall element bodies.

10. The frequency module according to claim 9, further comprising:
a shield film covering a surface of the sealing resin layer except for the island-shaped region.

11. The frequency module according to claim 9, further comprising:
a surface layer conductor arranged on the main surface of the wiring substrate so as to contact each of the plurality of shield wall element bodies.

12. The frequency module according to claim 8, further comprising:
a shield film covering a surface of the sealing resin layer except for the island-shaped region.

13. The frequency module according to claim 12, further comprising:
a ground electrode arranged inside the wiring substrate and outside the island-shaped region; and
a via connecting the shield wall to the ground electrode.

14. The frequency module according to claim 13, further comprising:
a surface layer conductor arranged on the main surface of the wiring substrate so as to contact each of the plurality of shield wall element bodies.

15. The frequency module according to claim 12, further comprising:
a surface layer conductor arranged on the main surface of the wiring substrate so as to contact each of the plurality of shield wall element bodies.

16. The frequency module according to claim 8, further comprising:
a surface layer conductor arranged on the main surface of the wiring substrate so as to contact each of the plurality of shield wall element bodies.

17. The frequency module according to claim 1, further comprising:
a surface layer conductor arranged on the main surface of the wiring substrate so as to contact each of the plurality of shield wall element bodies.

18. The frequency module according to claim 1, further comprising:
at least one surface layer conductor being arranged so as to contact the plurality of shield wall element bodies.

* * * * *